United States Patent [19]

Yajima et al.

[11] Patent Number: 5,043,243

[45] Date of Patent: Aug. 27, 1991

[54] POSITIVE-WORKING QUINONE DIAZIDE PHOTORESIST COMPOSITION CONTAINING A DYE

[75] Inventors: Mikio Yajima; Shigemitsu Kamiya; Shoji Kawata, all of Kawasaki, Japan

[73] Assignee: Nippon Zeon Co., Ltd., Tokyo, Japan

[21] Appl. No.: 437,929

[22] Filed: Nov. 17, 1989

[51] Int. Cl.$^5$ .................... G03C 1/52; G03C 5/00
[52] U.S. Cl. .................... 430/191; 430/165; 430/192; 430/193; 430/326
[58] Field of Search ............. 430/191, 192, 196, 512, 430/165

[56] References Cited

U.S. PATENT DOCUMENTS

| | | | |
|---|---|---|---|
| 4,349,619 | 9/1982 | Kamoshida et al. | 430/196 |
| 4,575,480 | 3/1986 | Kotani et al. | 430/192 |
| 4,626,492 | 12/1986 | Eilbeck | 430/191 |
| 4,927,732 | 5/1990 | Merrem et al. | 430/191 |

Primary Examiner—Charles L. Bowers, Jr.
Assistant Examiner—Christopher G. Young
Attorney, Agent, or Firm—Wenderoth, Lind & Ponack

[57] ABSTRACT

A positive type photoresist composition comprising at least one alkali-soluble resin, at least one quinone diazide compound and a compound of the general formula (I)

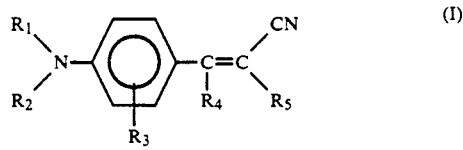

wherein $R_1$ and $R_2$ represents alkyl groups having 1 to 8 carbon atoms or a cycloalkyl group having 1 to 8 carbon atoms, $R_3$ represents hydrogen, an alkyl group having 1 to 4 carbon atoms or halogen, $R_4$ represents hydrogen or a cyano group and $R_5$ represents a cyano group or a carboxyl group.

6 Claims, No Drawings

POSITIVE-WORKING QUINONE DIAZIDE PHOTORESIST COMPOSITION CONTAINING A DYE

The present invention relates to an alkaline development type photosensitive resist composition employed primarily for pattern formation of semiconductor integrated circuits or photomasks, etc.. More particularly, the present invention relates to a positive type photoresist composition having an excellent ability for forming a fine pattern on reflective substrate which has topography.

Heretofore as a photoresist, a cyclized rubber type was used which has high sensitivity and high adhesion toward the substrate. With the higher integration densities of semiconductor circuits, an alkaline development type photoresist has been employed for pattern forming because a cyclized rubber type photoresist has limitations with respect to resolution. In the higher density integration of semiconductor integrated circuits, the necessity has developed that there must be formed a fine pattern of a size of not more than 1 $\mu$m. The exposure apparatus has been improved in order to permit the formation of fine patterns such as that. Owing mainly to an improvement in the performance of lenses, the resolution of a reduction projection exposure apparatus in common use today is not more than 1 $\mu$m but it is thought it has a limitation of about 0.6 to 0.5 $\mu$m. However, as the design size of integrated circuits approaches the limit of optical resolution, there is a growing necessity for resists of high resolution capable of forming a pattern precisely in this area.

In general, a planar process involves a step of forming a pattern on topography at almost all stages except the first stage of photolithography. During this step, the portion of the resist which is not exposed originally through the mask is subjected to reflected light from the uneven slope. As a result it is well known that the resolution power of the photoresist declines sharply compared with the case of a flat substrate. Because of this, the lines of the pattern on the photoresist become thinner than the corresponding lines on the mask in the case of a positive type photoresist, and the lines of the pattern on the photoresist become thicker or have whiskers in the case of a negative type photoresist.

On the other hand, since a reaction ion etching (RIE) by plasma instead of the wet-type etching wherein a substrate is dipped in the etching solution has been adopted mainly as the etching technique for the transfer of a resist pattern to a substrate, corresponding new performance of a resist as indicated below has been required.

First, since RIE has the property that etching proceeds only in the direction of the depth of the substrate, the size of the pattern can not be transferred precisely when a side wall of the resist pattern slants. Therefore, a resist requires a performance capable of forming a pattern which is nearer to a rectangle.

Second, in the case of RIE, when the treatment speed of etching increases, a heat deformation of the pattern occurs because the surface temperature of the resist rises. In order to prevent this situation, a technique is employed such that by irradiation with ultraviolet beam, the resist pattern is crosslinked. However, in this case the temperature of the resist pattern rises. In any case, the resist requires thermal resistance so that there is no deformation of the pattern.

Heretofore, it has been known to add a dye to a photoresist composition as a way of preventing a lowering of the resolution by reflected light in pattern formation on topography. As this dye, a monoazo type, a coumarin type, a pyrazolone type, an imidazoline type, an azomethyne type, a stylbene type, an acenaphthene type, etc. are used, but there arise certain problems discussed below and, unlike the dyes of the present invention, these could not satisfy the above requirements. On the heretofore employed dyes there were encountered problems of a lowering of sensitivity in the case of adding a sufficient amount of dye to absorb reflected light, of thinning line width of the pattern on topography in the case of dyes having little effect on lowering of sensitivity, and of insufficient thermal resistance of the resist because of low sublimation temperature in the case of dyes which absorb the light efficiently.

As a result of intensive study by the present inventors to resolve the above-mentioned defects, it has been found that when particular dyes are used in a positive type photoresist comprising alkali-soluble resins and quinone diazide compounds, the problems of the heretofore employed dyes are solved and the various kinds of problems encountered in the formation of ultra fine patterns for a high integration density can be solved.

Thus, according to the present invention, there is provided a positive type photoresist composition comprising at least one alkali-soluble resin, at least one quinone diazide compound and at least one compound which is represented by the general formula

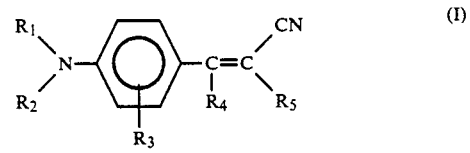

wherein $R_1$ and $R_2$ represent alkyl groups having 1 to 8 carbon atoms or a cycloalkyl group having 5 to 8 carbon atoms, $R_3$ represents hydrogen, an alkyl group having 1 to 4 carbon atoms or halogen, $R_4$ represents hydrogen or a cyano group and $R_5$ represents a cyano group or a carboxyl group.

Examples of the alkali-soluble resins in the present invention include a condensation reaction product between aromatic hydroxy compounds such as phenol or alkylphenol (e.g., cresol, xylenol, t-butyl phenol, etc.), and aldehydes (e.g., formaldehyde) in the presence of an acidic catalyst, polyvinyl phenol, polyisopropenyl phenol or a copolymer of vinyl phenol and isopropenyl phenol.

The quinone diazide compound is not particularly restricted and include an ester of a o-naphthoquinonediazide-4-sulfonic acid chloride or o-naphthoquinonediazide-5-sulfonic acid chloride. Concrete examples of these are described in detail in J. Kosar "Light Sensitive System", 339-352, (1965), John Wiley & Sons (New York) and W. S. DeForest "Photoresist", 50, (1975), McGRawHill Inc. (New York). Of these, an example which is produced industrially and is useful includes a naphthoquinone diazide sulfonic ester of 2,3,4-trihydroxy benzophenone, a naphthoquinone diazide sulfonic ester of 2,3,4,4'-tetrahydroxy benzophenone or a naphthoquinone diazide sulfonic ester of 2,2',4,4'-tetrahydroxy benzophenone.

The mixing ratio of the alkali-soluble resin to quinone diazide compound is 100 parts by weight to 10 to 50 parts by weight, preferably 15 to 40 parts by weight. When the employed amount of the quinone diazide is too high, developing residue is easy to produce and when the amount is too low, film loss becomes great and only a pattern with a rounded cross-sectional profile can be obtained and therefore the pattern cannot be transferred on a substrate in a precise size.

These alkali-soluble resins and naphthoquinone diazide compounds can be used singly or in combination. Thus a single resin or a mixture of resins and a single compound or a mixture of the compounds may be employed.

The compounds of general formula (I) include 2-(4-N,N-dimethyl-aminophenyl)-1,1-dicyanoethylene, 2-(4-N,N-di-n-hexylaminophenyl)-1,1-dicyanoethylene, 2-(4-N,N-dimethylaminophenyl-2-methyl)-1,1-dicyanoethylene, tricyano-(4-N,N-diethylaminophenyl)-ethylene, tricyano-(4-N,N-diethylamino-2-methylphenyl)-ethylene, 2-(4-N,N-di-n-hexylaminophenyl)-2-carboxy-1,1-dicyanoethylene, and 2-(4-N,N-di-hexylaminophenyl)-1-carboxy-1-cyanoethylene.

The amount of the compound of general formula (I) employed is 0.5 to 10 parts by weight, preferably 1 to 6 parts by weight, per 100 parts by weight of an alkali-soluble resin. In the case of using over 10 parts by weight, the pattern profile deteriorates, and in the case of using less than 0.5 parts by weight, the resolution declines in topography.

The resist composition of the present invention is used by dissolving the solid composition homogeneously in organic solvents.

Examples of the solvent employed include alcohols such as propanol and butanol, ketones such as methyl ethyl ketone, methyl isobutyl ketone and cyclohexanone, acetates such as ethyl acetate, butyl acetate and isoamyl acetate, cyclic ethers such as tetrahydrofuran and dioxane, cellosolves such as methyl cellosolve, ethyl cellosolve and butyl cellosolve, ethyl cellosolve acetate, butyl cellosolve acetate, γ-butyrolactone, etc. Also, an aromatic hydrocarbon such as xylene, toluene, etc. can be mixed with those solvents. The amount of solid composition employed is usually about 10 to 40 parts by weight.

The resist composition of the present invention may contain additional additives such as a surfactant and a sensitizer.

As the developer for the resist composition of the present invention, inorganic alkali such as sodium hydroxide, potassium hydroxide and sodium metasilicate, and organic alkali such as tetramethyl ammonium hydroxide and choline are used. Also, amines, alcohols, ethers and surfactants can be used by mixing them with those developers.

After the resist composition of the present invention is spin-coated on a substrate, it is treated thermally at about 100° C. thus forming a resist film of about 1 m which is then exposed and developed and a pattern is formed. Exposure is usually carried out by an ultraviolet exposure apparatus such as contact alignor, projection alignor and stepper, etc.

It is preferred that the development be carried out by dipping the exposed substrate in developer for about 1 minute or by puddle development.

According to the present invention, a positive type photoresist is provided which has an excellent resolution even on reflective substrate which has topography, good thermal resistance and little change in the size of the pattern.

The following examples more specifically illustrate the present invention.

Parts and per cent in the examples and the comparative examples are by weight except as otherwise provided.

Evaluation in the examples and the comparative examples is obtained according to the tests below.

Sensitivity

Sensitivity is shown by the minimum exposure time in msec units which is necessary for exposing a pattern having a line width of 5 μm.

Minimum resolution line width

The minimum resolution line width is the most narrow line width of 1 vs. 1 line and space pattern which can be resolved by increasing the exposure time from the exposure time corresponding to the sensitivity of the photoresist up to 400 msec in increment steps of 20 msec.

Shape of section

When a cut section of the pattern having a minimum resolution line width observed is a rectangle, this is shown by the symbol O. When a trapezoid is observed, this is shown by the symbol X.

Pattern width

A window pattern of 2.0 by 2.0 μm square is formed by etching a silicone dioxide film of 0.20 μm and a film of tungsten siliside is deposited on this by chemical vapor deposition. The resist is coated on this substrate in the previously mentioned manner and a line of 1.0 μmm is exposed and developed so that resist pattern can be piled up in half of concave part of a substrate. A stepper having line of NA=0.35 is used for exposure. The thickness of the resist pattern is evaluated by measurement of the line width of the most narrow part of the resist pattern thus formed on the concave part. Based on 1.0 μm of reticle size, the thinner the most narrow part of the resist pattern is, the worse the result is. This result is the so-called halation prevention effect.

Thermal resistance

A cut section of 5 μm pattern is treated for 200 seconds on a hot plate at 140° C., if the section maintains a rectangle profile, thermal resistance is shown by O, and when the section demonstrates a round profile it is shown by X.

A scanning electron microscope is used for this evaluation.

EXAMPLE 1

100 Parts by weight of novolak resin having a number average molecular weight of 1200 wherein the molar ratio of m-cresol:p-cresol is 6:4, 25 parts by weight of o-naphthoquinone diazide-5-sulfonic chloride ester of 2,3,4-trihydroxy benzophenone (the reaction product being prepared using a molar ratio of the latter: the former of 1.7) and 2 parts by weight of 2-(4-N,N-di-n- hexylamino-phenyl)-1,1-dicyanoethylene as a compound of general formula (1) were dissolved in cellosolve acetate. This solution was filtered through a teflon membrane filter of 0.2 microns and a resist composition was obtained.

This resist composition was coated onto a silicon specular wafer by a spin-coater, the coated wafer was prebaked at for 30 minutes in an air oven and then exposed by stepper through the reticle having a 1 vs. 1 line and space pattern at intervals of every 0.05 μm from 1.0 μm to 0.6 μm. At the same time, a 5 μm line and space pattern was exposed This wafer was developed in 2.4% teramethyl ammonium hydroxide by puddle method.

As a result of evaluation, the sensitivity was 200 msec, minimum resolution line width was 0.8 μm, shape of section was O, pattern width was 1.1 μm and thermal resistance was O.

EXAMPLE 2

An experiment was carried out in the same way as Example 1 except using 2-(4-N,N-di-n-hexylamino-phenyl)-1-carboxy-l-cyano-ethylene as the compound of general formula (I).

As a result of evaluation, sensitivity was 160 msec, minimum resolution line width was 0.8 μm, shape of section was O, pattern width was 1.0 μm and thermal resistance was O.

Comparative Example 1

An experiment was carried out in the same way as Example 1 except using 4-(4-diethylaminophenylazo)-phenol which is an azo type dye in place of the dye used in the present invention.

As a result of evaluation, sensitivity was 300 msec, minimum resolution line width was 1.0 μm, shape of section was X, pattern width was 0.9 μm and thermal resistance was O.

Comparative Example 2

An experiment was carried out in the same way as Example 1 except using coumarin 314 which is a coumarin type dye in place of the dye used in the present invention. As a result of evaluation, sensitivity was 280 msec, minimum resolution line width was 1.0 μm, shape of section was X, pattern width was 0.8 μm and thermal resistance was X.

From the comparison between the above Examples and Comparative Examples, it can be seen that the positive-type photoresist composition of the present invention can form a highly precise fine pattern, preventing the decline of resolution by the reflection from a substrate without making the sensitivity, pattern shape and thermal resistance worse.

What is claimed is:

1. A positive type photoresist composition comprising at least one alkali-soluble resin, at least one quinone diazide compound and a compound of the formula (I)

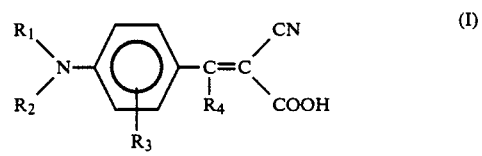

wherein $R_1$ and $R_2$ represents alkyl having 1 to 8 carbon atoms or cycloalkyl having 1 to 8 carbon atoms, $R_3$ represents hydrogen, alkyl having 1 to 4 carbon atoms or halogen, and $R_4$ represents hydrogen or cyano.

2. A composition of claim 1 comprising 100 parts by weight of alkali-soluble resins, 10 to 50 parts by weight of quinone diazide compound and 0.5 to 10 parts by weight of a compound of general formula (I).

3. A composition of claim 1 comprising 100 parts by weight of alkali-soluble resin 15 to 40 parts by weight of quinone diazide compound and 1 to 6 parts by weight of a compound of general formula (I).

4. A composition of claim 1 wherein the alkali-soluble resin is a condensation reaction product of an aromatic hydroxy compound and an aldehyde, or a polyvinylphenol, a polyisopropenyl phenol, or a copolymer of vinyl phenol and isopropenyl phenol.

5. A composition of claim 1 wherein the quinone diazide compound is an ester of o-naphthoquinodiazide-4-sulfonic acid chloride or an ester of o-naphthoquinondiazide-5-sulfonic acid chloride.

6. A composition of claim 1 wherein the compound of general formula (I) is
2-(4-N,N-di-hexylaminophenyl)-1-carboxy-1-cyano-ethylene.

* * * * *